US012772399B2

(12) United States Patent
Liu

(10) Patent No.: US 12,772,399 B2
(45) Date of Patent: Oct. 20, 2026

(54) EMERGENCY STARTING POWER SUPPLY FOR VEHICLE

(71) Applicant: Shenzhen Zhanpusida Technology Co., Ltd., Shenzhen (CN)

(72) Inventor: Yong Liu, Shenzhen (CN)

(73) Assignee: Shenzhen Zhanpusida Technology Co., Ltd., Shenzhen (CN)

( * ) Notice: Subject to any disclaimer, the term of this patent is extended or adjusted under 35 U.S.C. 154(b) by 0 days.

(21) Appl. No.: 19/465,044

(22) Filed: Jan. 30, 2026

(65) Prior Publication Data

US 2026/0156763 A1 Jun. 4, 2026

Related U.S. Application Data

(63) Continuation of application No. 18/932,602, filed on Oct. 30, 2024, which is a continuation of application
(Continued)

(30) Foreign Application Priority Data

Nov. 16, 2023 (CN) ......................... 202323131586.9

(51) Int. Cl.
*H05K 5/00* (2025.01)
*B60R 16/033* (2006.01)
(Continued)

(52) U.S. Cl.
CPC ......... *H05K 5/0247* (2013.01); *B60R 16/033* (2013.01); *H02J 1/122* (2020.01); *H05K 5/0217* (2013.01); *H05K 7/1427* (2013.01)

(58) Field of Classification Search
CPC .. H05K 5/0247; H05K 5/0217; H05K 7/1427; H02J 1/122; B60R 16/033
See application file for complete search history.

(56) References Cited

U.S. PATENT DOCUMENTS

2008/0150473 A1 6/2008 Wise
2009/0230783 A1 9/2009 Weed et al.
(Continued)

FOREIGN PATENT DOCUMENTS

CN 203312874 U 11/2013
CN 207638352 U 7/2018
(Continued)

OTHER PUBLICATIONS

Decision to Grant a Patent issued in counterpart Japanese Patent Application No. JP 2024-199252, dated Dec. 18, 2025.

*Primary Examiner* — Pete T Lee
(74) *Attorney, Agent, or Firm* — Westbridge IP LLC

(57) ABSTRACT

An emergency starting power supply for vehicles includes a shell, a power source, a circuit board, and an output terminal. The shell is provided with a first accommodating space and a first mounting part. The power source and circuit board are housed in the first accommodating space. The power source is electrically connected to the circuit board and the output terminal, respectively. The first mounting part is provided with a second accommodating space. At least a portion of the output terminal is housed in the second accommodating space. The output terminal is configured to output a current for starting an engine of the vehicle.

16 Claims, 12 Drawing Sheets

Related U.S. Application Data

No. 18/608,984, filed on Mar. 19, 2024, now Pat. No. 12,171,079.

(51) Int. Cl.

| | |
|---|---|
| ***H02J 1/10*** | (2006.01) |
| ***H05K 5/02*** | (2006.01) |
| ***H05K 7/14*** | (2006.01) |

(56) References Cited

U.S. PATENT DOCUMENTS

| | | | | |
|---|---|---|---|---|
| 2014/0292272 | A1 | 10/2014 | Inagaki et al. | |
| 2017/0012448 | A1 | 1/2017 | Miller et al. | |
| 2017/0229894 | A1* | 8/2017 | Durando | H02J 1/122 |
| 2020/0072177 | A1* | 3/2020 | Clarke | F02N 11/0862 |
| 2020/0290535 | A1 | 9/2020 | Wang et al. | |
| 2021/0091578 | A1* | 3/2021 | Miller | G06F 1/26 |
| 2023/0010475 | A1 | 1/2023 | Miller et al. | |
| 2023/0208135 | A1* | 6/2023 | Hacker Davidson | H02J 1/122 320/137 |

FOREIGN PATENT DOCUMENTS

| | | | | | |
|---|---|---|---|---|---|
| CN | 208862632 | U | * | 5/2019 | |
| CN | 110676901 | A | | 1/2020 | |
| CN | 209982130 | U | | 1/2020 | |
| CN | 215398553 | U | | 1/2022 | |
| CN | 215990296 | U | | 3/2022 | |
| CN | 217063328 | U | | 7/2022 | |
| CN | 217183013 | | | 8/2022 | |
| CN | 217769611 | | | 11/2022 | |
| CN | 219287171 | | | 6/2023 | |
| CN | 116914481 | A | * | 10/2023 | H02J 7/70 |
| JP | S5753750 | | | 3/1982 | |
| JP | 2022109256 | | | 7/2022 | |

* cited by examiner

EMERGENCY STARTING POWER SUPPLY FOR VEHICLE

CROSS-REFERENCE TO RELATED APPLICATIONS

The present disclosure is a continuation application of U.S. patent application Ser. No. 18/932,602, filed on Oct. 30, 2024, which is a continuation application of U.S. patent application Ser. No. 18/608,984, filed on Mar. 19, 2024, which claims priority to Chinese Patent Application No. 202323131586.9, filed on Nov. 16, 2023. All of the aforementioned applications are incorporated herein by reference in their entireties.

TECHNICAL FIELD

The present disclosure relates to the technical field of emergency starting power supply for vehicles, and particularly to an emergency starting power supply for vehicles.

BACKGROUND

Currently, the emergency starting power supply for vehicles is a multifunctional and portable mobile power source developed for car enthusiasts and business professionals who drive. Its distinctive feature is its ability to start a car when it experiences a dead battery or other reasons preventing it from starting. Simultaneously, combining features such as an inflatable pump with the emergency starting power supply for vehicles and outdoor lighting makes it an essential product for outdoor travel. However, in the existing technology, there are issues with the mounting instability and poor reliability of the power source, circuit board, and output terminals within the shell of the emergency starting power supply for vehicles. This leads to a relatively low lifespan for the emergency starting power supply for vehicles.

SUMMARY

In view of this, the objective of the present disclosure is to overcome the shortcomings in the existing technology and provide an emergency starting power supply for vehicles.

In order to solve the above technical problems, the present disclosure provides an emergency starting power supply for vehicles, comprising a shell, a power source, a circuit board, and an output terminal, wherein the shell is provided with a first accommodating space and a first mounting part; the power source and circuit board are housed in the first accommodating space; the power source is electrically connected to the circuit board and the output terminal, respectively; the first mounting part is provided with a second accommodating space; at least a portion of the output terminal is housed in the second accommodating space; and the output terminal is configured to output a current for starting an engine of the vehicle.

Additionally, according to the emergency starting power supply for vehicles in the present disclosure, the following additional technical features can be comprised.

In some embodiments of the present disclosure, the first mounting part is provided with at least one third protrusion configured for limiting the circuit board.

In some embodiments of the present disclosure, the first mounting part is provided with at least one first opening configured for mounting cables connected to the output terminal.

In some embodiments of the present disclosure, a second opening is provided below the first opening.

In some embodiments of the present disclosure, the shell comprises a first shell and a second shell; the first shell is provided with the first mounting part; and the second shell is provided with a sixth protrusion, wherein the sixth protrusion is configured to limit the output terminal.

In some embodiments of the present disclosure, a first cover body is further comprised, wherein the first cover body is fixedly connected to the first mounting part and is configured to limit the output terminal.

In some embodiments of the present disclosure, the output terminal is arranged between the first mounting part and the circuit board.

In some embodiments of the present disclosure, a portion of the circuit board covers a portion of the first mounting part.

In some embodiments of the present disclosure, the circuit board, the first mounting part, and the output terminal are arranged on a same side of the power source.

In some embodiments of the present disclosure, the output terminal is provided with a first coupling part, the first mounting part is provided with a second coupling part, and the first coupling part is detachably connected to the second coupling part.

In some embodiments of the present disclosure, the first coupling part and the second coupling part are slidingly connected.

In some embodiments of the present disclosure, the first coupling part is a first protrusion, and the second coupling part is a receiving groove; during the mounting process, the first coupling part slides through the second coupling part to a predetermined position.

In some embodiments of the present disclosure, the first coupling part is arranged at an outer edge of an end part of the output terminal facing the first accommodating space.

In some embodiments of the present disclosure, the first mounting part is provided with a first through-hole; one end of the output terminal passes through the first through-hole, and one end of the output terminal that does not pass through the first through-hole is provided with the first coupling part.

In some embodiments of the present disclosure, the first coupling part is connected to the second coupling part by a screw.

In some embodiments of the present disclosure, a head of the screw is arranged within the second accommodating space.

In some embodiments of the present disclosure, the shell comprises a first shell and a second shell; the first shell is provided with the first mounting part; and the second shell is provided with a button.

In some embodiments of the present disclosure, the second shell comprises a first sub-second shell and a second sub-second shell; the first sub-second shell is provided with a button, and the second sub-second shell is provided with a second through-hole; and when using the button, the button undergoes displacement towards the second through-hole.

In some embodiments of the present disclosure, the button is integrally molded with the first sub-second shell.

In some embodiments of the present disclosure, the button is injection-molded onto the second shell.

In some embodiments of the present disclosure, the second shell is provided with a first translucent layer.

In some embodiments of the present disclosure, a material of the first translucent layer is one of PVC, PC, or acrylic.

In some embodiments of the present disclosure, the shell further comprises a third shell, wherein the third shell is provided with a third accommodating space; the first shell is provided with a first bending part, and the second shell is provided with a third bending part, and the first bending part and the third bending part are housed in the third accommodating space.

In some embodiments of the present disclosure, the third shell is snapped to the first bending part.

In some embodiments of the present disclosure, an inner surface of the third shell is provided with at least one fourth protrusion, and the first bending part is provided with at least one fifth protrusion; and the fourth protrusion is snapped with the fifth protrusion.

In some embodiments of the present disclosure, the fifth protrusion is arranged at an end away from the button.

In some embodiments of the present disclosure, the fifth protrusion is in a stepped shape.

In some embodiments of the present disclosure, the shell also comprises a fourth shell; the third shell is provided with a third through-hole; the third through-hole forms the third accommodating space; and the fourth shell covers the third through-hole on a side away from the first bending part and the third bending part.

In some embodiments of the present disclosure, the first bending part is provided with a second bending part, the third bending part is provided with a fourth bending part, and the fourth shell is provided with a second protrusion; the second bending part, the fourth bending part, and the third shell form a fourth accommodating space, and the second protrusion is housed in the fourth accommodating space.

In some embodiments of the present disclosure, one side of the second protrusion is provided with a third opening; and one of the third shell, the second bending part, and the fourth bending part is provided with a seventh protrusion that cooperates with the third opening.

In some embodiments of the present disclosure, at least one of the third shell, the second bending part, and the fourth bending part are snapped with the second protrusion.

In some embodiments of the present disclosure, the circuit board is arranged between the power source and the shell, and a first protective component is arranged between the power source and the circuit board.

In some embodiments of the present disclosure, at least one side of the first protective component is provided with an adhesive layer.

In some embodiments of the present disclosure, a display device is further comprised, and the circuit board is provided with a fourth through-hole. The display device is arranged on a side of the circuit board away from the power source and is positioned at the fourth through-hole.

In some embodiments of the present disclosure, a second translucent layer is further comprised, wherein the second translucent layer covers the display device on a side away from the circuit board.

In some embodiments of the present disclosure, the fourth through-hole, on a side near the power source, is provided with a second protective component.

In some embodiments of the present disclosure, the second protective component completely covers the fourth through-hole.

In some embodiments of the present disclosure, a light-emitting element is further comprised, wherein the light-emitting element is arranged on the circuit board or the shell, and the circuit board is electrically connected to the light-emitting element.

In some embodiments of the present disclosure, a light-emitting element and a first bracket fixed to the light-emitting element are further comprised; the light-emitting element is electrically connected to the circuit board, and the first bracket is detachably connected to the shell.

In some embodiments of the present disclosure, the first bracket is provided with a fifth accommodating space, and at least a portion of the light-emitting element is housed in the fifth accommodating space.

In some embodiments of the present disclosure, the first bracket is provided with a limiting part, wherein the limiting part is configured to limit a displacement of the light-emitting element within the fifth accommodating space.

In some embodiments of the present disclosure, a lamp cup is further comprised, wherein the first bracket is provided with a sixth accommodating space, and at least a portion of the lamp cup is housed in the sixth accommodating space.

In some embodiments of the present disclosure, a light-emitting element is further comprised, and the shell is provided with a second mounting part, and the light-emitting element is arranged on the second mounting part.

In some embodiments of the present disclosure, the second mounting part and the first mounting part are on a same side or opposite sides of the shell.

In some embodiments of the present disclosure, the second mounting part is provided with a seventh accommodating space, and at least a portion of the light-emitting element is housed in the seventh accommodating space.

In some embodiments of the present disclosure, a lamp cup is further comprised, wherein the shell is provided with a third mounting part; a first end of the lamp cup is arranged on the second mounting part and is connected to the light-emitting element, and a second end of the lamp cup is arranged on the third mounting part.

In some embodiments of the present disclosure, a lamp cup and a lampshade are further comprised, wherein the lampshade is provided with an eighth accommodating space, and at least a portion of the lamp cup is housed in the eighth accommodating space; the shell is provided with a third mounting part; a first end of the lampshade is arranged on the second mounting part and is connected to the light-emitting element; and a second end of the lampshade is arranged on the third mounting part.

In some embodiments of the present disclosure, the third mounting part is provided with a ninth accommodating space, and at least a portion of the lampshade is housed in the ninth accommodating space.

In some embodiments of the present disclosure, a lowest end of a connection portion between the second mounting part and the lamp cup is higher than a lowest end of a connection portion between the third mounting part and the lamp cup.

In some embodiments of the present disclosure, an inflatable pump is further comprised, wherein the circuit board is electrically connected to the inflatable pump.

In some embodiments of the present disclosure, the inflatable pump comprises a first air outlet, a hose, and an air guide member; one end of the hose is connected to the first air outlet, the other end of the hose is connected to the air guide member, and the air guide member is detachably connected to the shell.

In some embodiments of the present disclosure, the air guide member is provided with an air inlet and a second air outlet, wherein the air inlet is connected to the hose, and the air inlet and the second air outlet are on different axes.

In some embodiments of the present disclosure, a sealing member is further comprised, wherein the air guide member is provided with communication holes respectively communicating with the air inlet and the second air outlet, and the sealing member is configured to seal the communication hole.

In some embodiments of the present disclosure, an axis of the communication hole is perpendicular to an axis of the second air outlet.

Compared with the prior art, the beneficial effects of the present disclosure are as follows.

The present disclosure provides an emergency starting power supply for vehicles. By electrically connecting the power source to the output terminal, the output terminal can output the current needed to start the car engine, thereby achieving the emergency starting function of the emergency starting power supply for vehicles. By connecting the power source to the circuit board, the circuit board can also output the current required for other electrical devices. By housing the power source and the circuit board in the first accommodating space of the shell, the power source and the circuit board are stably mounted in the first accommodating space, thus improving the mounting stability and reliability of the power source and the circuit board. Simultaneously, by housing at least a portion of the output terminal in the second accommodating space of the first mounting part of the shell, the output terminal is securely mounted in the second accommodating space. This enhances the mounting stability and reliability of the output terminal, thereby extending the lifespan of the emergency starting power supply for vehicles.

BRIEF DESCRIPTION OF THE DRAWINGS

To more clearly illustrate the technical solutions of the embodiments of the present disclosure, the following will briefly introduce the drawings used in the embodiments. It should be understood that the following drawings only show some embodiments of the present disclosure, and therefore they should not be regarded as a limitation on the scope. Those ordinary skilled in the art can also obtain other related drawings based on these drawings without inventive effort.

DETAILED DESCRIPTION OF THE EMBODIMENTS

Figure 1:
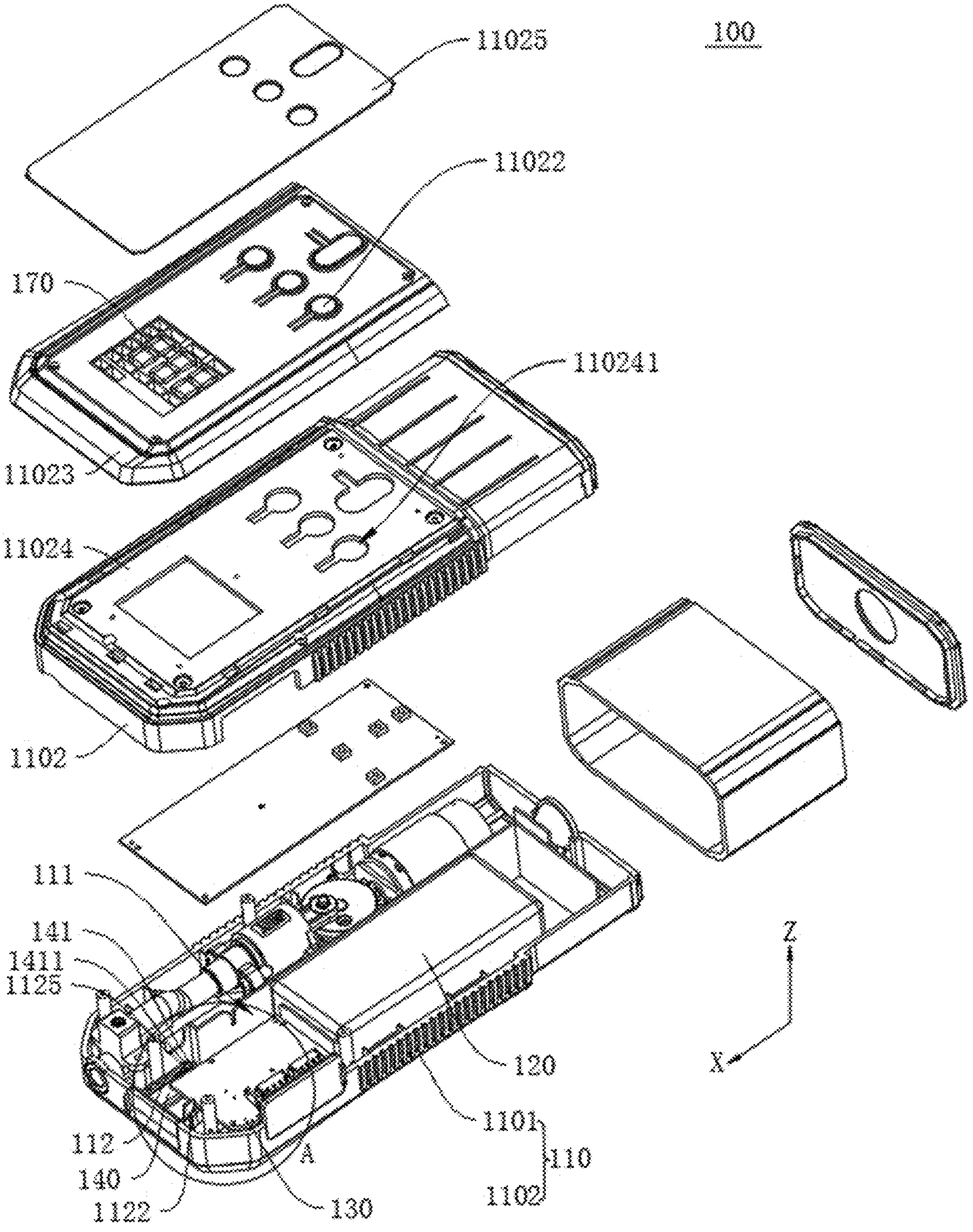
FIG. 1 shows an exploded schematic diagram I of an emergency starting power supply for vehicles in some embodiments of the present disclosure.

The following is a detailed description of the embodiments of the present disclosure, with examples shown in the drawings. Throughout the description, similar or identical reference numerals indicate corresponding or similar elements with the same or similar functions. The embodiments described below by reference to the drawings are exemplary and are intended only to explain the present disclosure and are not to be construed as a limitation of the present disclosure.

In the description of the present disclosure, it is to be understood that the terms “center”, “longitudinal”, “lateral”, “length”, “width”, “thickness”, “top”, “bottom”, “front”, “back”, “left”, “right”, “vertical”, “horizontal”, “top”, “bottom”, “inside”, “outer”, “clockwise”, “counterclockwise”, “axial”, “radial” , “circumferential”, etc. indicate orientations or positional relationships based on those shown in the drawings, and are intended only to facilitate the description of the present disclosure and to simplify the description, and are not intended to indicate or imply that the device or element referred to must have a particular orientation, be constructed and operated in a particular orientation, and therefore cannot be construed as a limitation of the present disclosure.

Additionally, the terms “first” and “second” are used for descriptive objectives only and should not be understood as indicating or implying relative importance or specifying the quantity of the indicated technical features. Consequently, features labeled with “first” or “second” can explicitly or implicitly include one or more of those features. In the description of the present disclosure, the term “multiple” means two or more, unless otherwise explicitly specified.

In the present disclosure, unless otherwise clearly stipulated and limited, the terms “mount”, “link”, “connect”, and “fix” should be understood in a broad sense, for example, it can be a fixed connection, a detachable connection, or an integral connection; it can be a mechanical connection, an electrical connection, a direct connection, an indirect connection through an intermediary, an internal communication between two components, or the interaction relationship between two components. Those of ordinary skill in the art can understand the meanings of the above terms in the present disclosure according to specific situations.

In the present disclosure, unless otherwise expressly provided and limited, the first feature "on" or "under" the second feature may be a direct contact between the first and second features, or an indirect contact between the first and second features through an intermediate medium. Furthermore, the first feature being "above", "over" and "on top of" the second feature can mean that the first feature is directly above or diagonally above the second feature, or simply that the first feature is horizontally higher than the second feature. The first feature is "under", "below", and "beneath" the second feature can mean that the first feature is directly below or diagonally below the second feature, or it can simply mean that the horizontal height of the first feature is less than that of the second feature.

Figure 2:
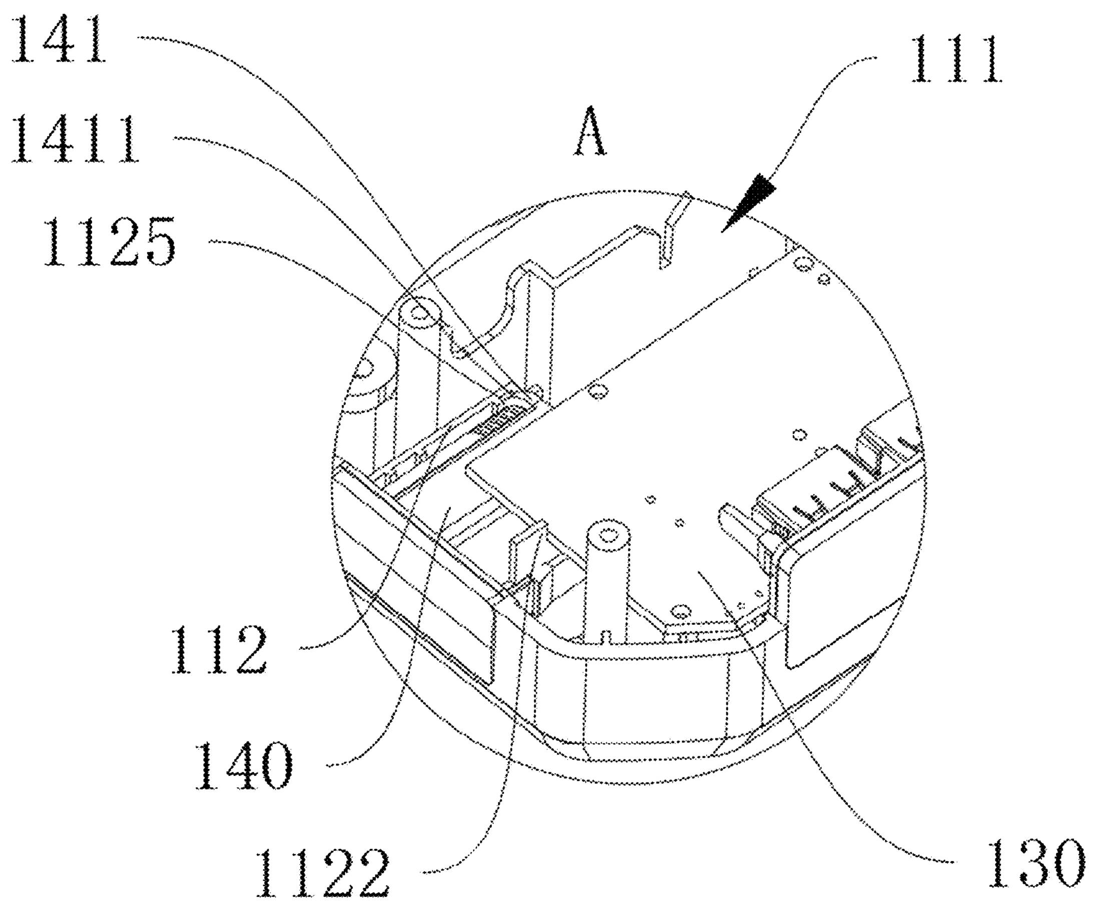
FIG. 2 shows an enlarged schematic view of the structure of part A of FIG. 1.
Figure 3:
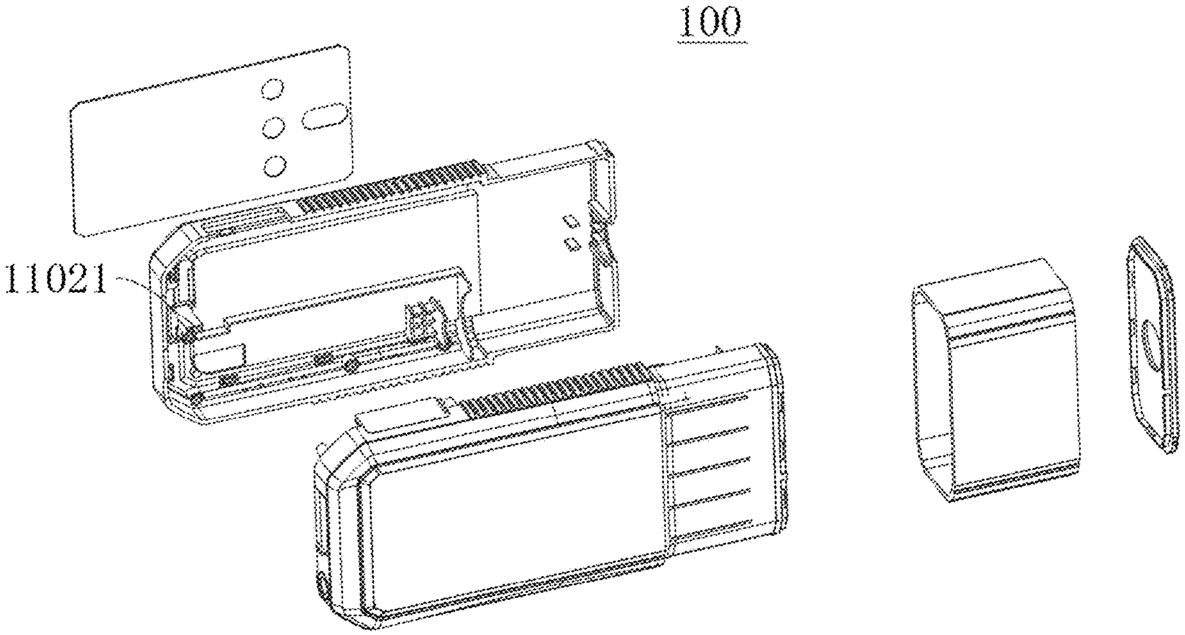
FIG. 3 shows an exploded schematic diagram II of the emergency starting power supply for vehicles in some embodiments of the present disclosure.

As shown in FIGS. 1, 2, and 3, an emergency starting power supply for vehicles 100, provided in the embodiments of the present disclosure, is primarily configured to provide emergency power to start a car when the car experiences a dead battery or other issues preventing it from starting. The emergency starting power supply for vehicles 100 includes a shell 110, a power source 120, a circuit board 130, and an output terminal 140.

Figure 4:
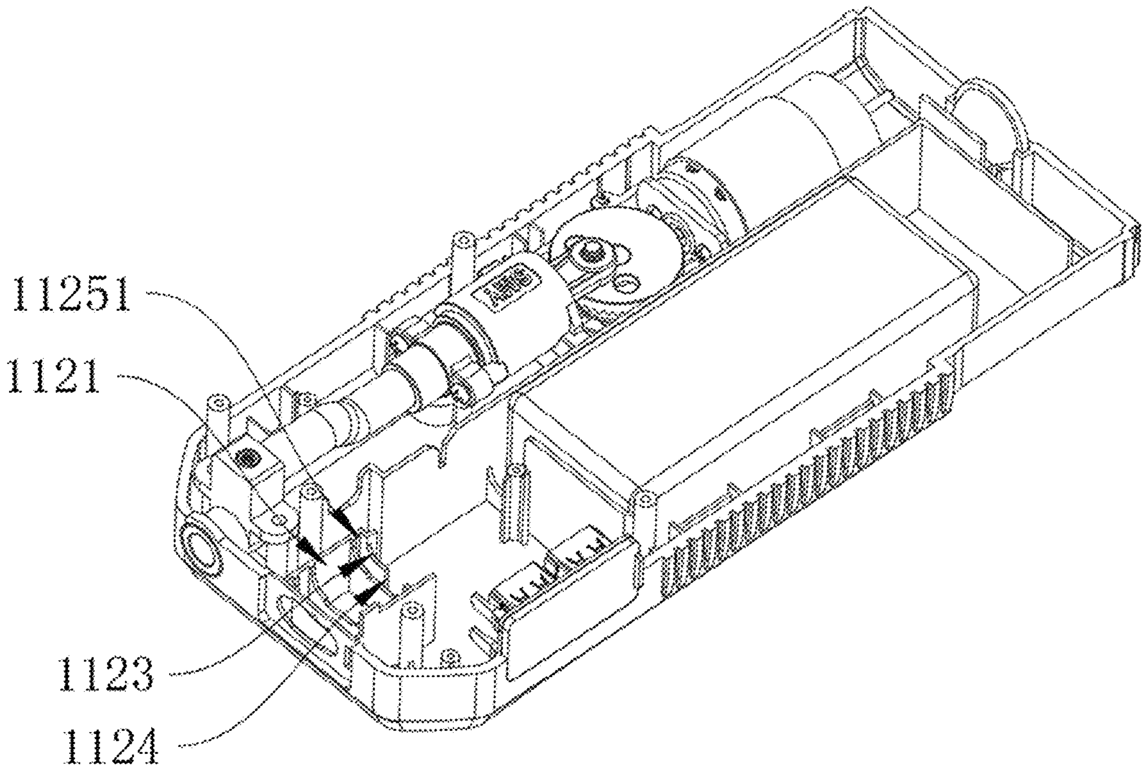
FIG. 4 shows a partial three-dimensional schematic diagram I of the emergency starting power supply for vehicles in some embodiments of the present disclosure.

Referring to FIG. 4 together, the shell 110 is provided with a first accommodating space 111 and a first mounting part 112. The power source 120 and circuit board 130 are housed in the first accommodating space 111. The power source 120 is electrically connected to the circuit board 130 and the output terminal 140, respectively. The first mounting part 112 is provided with a second accommodating space 1121. At least a portion of the output terminal 140 is housed in the second accommodating space 1121. The output terminal 140 is configured to output a current for starting an engine of the vehicle.

The emergency starting power supply for vehicles 100 provided by the embodiments of the present disclosure, by electrically connecting the power source 120 to the output terminal 140, enables the output terminal 140 to output the current needed to start the car engine, thereby achieving the emergency starting function of the emergency starting power supply for vehicles 100. By connecting the power source 120 to the circuit board 130, the circuit board 130 can also output the current required for other electrical devices, such as mobile phones.

By housing the power source 120 and the circuit board 130 in the first accommodating space 111 of the shell 110, the power source 120 and the circuit board 130 are stably mounted in the first accommodating space 111 of the shell 110, thus improving the mounting stability and reliability of the power source 120 and the circuit board 130. Simultaneously, by housing at least a portion of the output terminal 140 in the second accommodating space 1121 of the first mounting part 112 of the shell 110, the output terminal 140 is securely mounted in the second accommodating space 1121 of the first mounting part 112 of the shell 110. This enhances the mounting stability and reliability of the output terminal 140, thereby extending the lifespan of the emergency starting power supply for vehicles 100.

As shown in FIGS. 1, 2, and 4, in some embodiments of the present disclosure, optionally, the first mounting part 112 is provided with at least one third protrusion 1122, wherein the third protrusion 1122 is configured for limiting the circuit board 130. As a result, the displacement of the circuit board 130 in the first direction is limited by the third protrusion 1122, which improves the mounting efficiency, stability, and reliability of the circuit board 130. Exemplarily, the first mounting part 112 provides support to the circuit board 130 in the second direction, thus enabling a gap between the circuit board 130 and the output terminal 140. This prevents interference between the two structures that will cause damage to the circuit board 130.

It should be noted that the first direction is the length direction of the shell 110, corresponding to the X direction in FIG. 1, and the second direction is the thickness direction of the shell 110, corresponding to the Z direction in FIG. 1.

As shown in FIGS. 1, 2, and 4, in some embodiments of the present disclosure, optionally, the first mounting part 112 is provided with at least one first opening 1123 configured for mounting cables connected to the output terminal 140. Therefore, by arranging the first opening 1123 in the first mounting part 112, the first opening 1123 serves as a clearance, making it easier for one end of the cable to be electrically connected to the power source 120. The other end passes through the first opening 1123 to connect with the output terminal 140, thereby achieving the functionality of the electrical connection between the output terminal 140 and the power source 120.

As shown in FIGS. 1, 2, and 4, in some embodiments of the present disclosure, optionally, a second opening 1124 is provided below the first opening 1123. In the embodiment, the first mounting part 112 is injection-molded using a mold. A second opening 1124 is provided on the first mounting part 112 below the first opening 1123 to enhance the strength of the mold.

As shown in FIGS. 1, 2, 3, and 4, in one embodiment of the present disclosure, optionally, the shell 110 comprises a first shell 1101 and a second shell 1102; the first shell 1101 is provided with the first mounting part 112; and the second shell 1102 is provided with a sixth protrusion 11021, wherein the sixth protrusion 11021 is configured to limit the output terminal 140. In the embodiment, by arranging a sixth protrusion 11021 on the second shell 1102, when the second shell 1102 is closed with the first shell 1101, the sixth protrusion 11021 can abut against the output terminal 140 so as to ensure that the output terminal 140 is confined within the second accommodating space 1121 of the first mounting part 112, thus preventing the output terminal 140 from moving or detaching from the second accommodating space 1121. This enhances the mounting stability and reliability of the output terminal 140, thereby extending the lifespan of the product.

Figure 15:
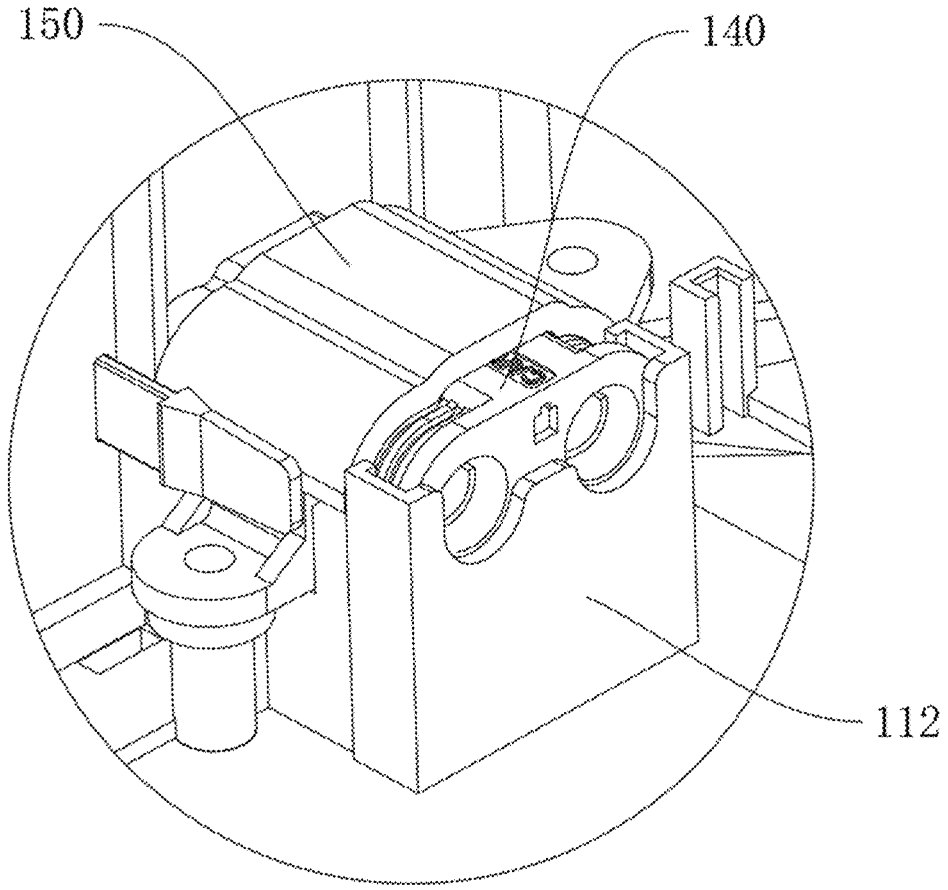
FIG. 15 shows a partially enlarged schematic diagram of the emergency starting power supply for vehicles in some embodiments of the present disclosure.

As shown in FIG. 15, in some embodiments of the present disclosure, optionally, a first cover body 150 is further comprised, wherein the first cover body 150 is fixedly connected to the first mounting part 112 and is configured to limit the output terminal 140. In the embodiment, by arranging the first cover body 150 fixedly connected to the first mounting part 112, the output terminal 140 is confined within the second accommodating space 1121 of the first mounting part 112, thus preventing the output terminal 140 from moving or detaching from the second accommodating space 1121. This enhances the mounting stability and reliability of the output terminal 140, thereby extending the lifespan of the product.

As shown in FIGS. 1, 2, and 4, in one embodiment of the present disclosure, optionally, in some embodiments of the present disclosure, the output terminal 140 is arranged between the first mounting part 112 and the circuit board 130. In the embodiment, by arranging the output terminal 140 between the first mounting part 112 and the circuit board 130, the first accommodating space 111 is effectively utilized, which enables a compact structural layout.

As shown in FIGS. 1, 2, 3, and 4, in the above embodiments of the present disclosure, optionally, in some embodiments of the present disclosure, a portion of the circuit board 130 covers a portion of the first mounting part 112. Consequently, the sixth protrusion 11021 is able to abut against the output terminal 140 without interference with the circuit board.

As shown in FIGS. 1, 2, and 4, in one embodiment of the present disclosure, optionally, in some embodiments of the present disclosure, the circuit board 130, the first mounting part 112, and the output terminal 140 are arranged on a same side of the power source 120. In the embodiments, by arranging the first mounting part 112 and the output terminal 140 on the same side of the power source 120, it improves space utilization and mounting efficiency.

As shown in FIGS. 1, 2, and 4, in one embodiment of the present disclosure, optionally, the output terminal 140 is provided with a first coupling part 141, the first mounting part 112 is provided with a second coupling part 1125, and the first coupling part 141 is detachably connected to the second coupling part 1125. Therefore, the output terminal 140 can be detachably connected to the second coupling part 1125 of the first mounting part 112 through the first coupling part 141, thus improving the efficiency of mounting and removal for the output terminal 140.

As shown in FIGS. 1, 2, and 4, in some embodiments of the present disclosure, optionally, the first coupling part 141 and the second coupling part 1125 are slidingly connected. This facilitates the mounting and removal between the output terminal 140 and the first mounting part 112, thus improving the smoothness of the mounting and removal processes.

As shown in FIGS. 1, 2, and 4, in the above embodiments of the present disclosure, optionally, the first coupling part 141 is a first protrusion 1411, and the second coupling part 1125 is a receiving groove 11251; during the mounting process, the first coupling part 141 slides through the second coupling part 1125 to a predetermined position. Through the sliding connection between the first protrusion 1411 and the receiving groove 11251, the smoothness of the mounting and removal processes is effectively enhanced.

As shown in FIGS. 1, 2, and 4, in the above embodiments of the present disclosure, optionally, the first coupling part 141 is arranged at an outer edge of an end part of the output terminal 140 facing the first accommodating space 111. This makes it easy to press and slide the first coupling part 141 into the second coupling part 1125 during mounting or to pivot and slide the first coupling part 141 out of the second coupling part 1125 during disassembly, thereby enhancing the efficiency of mounting and removal.

Figure 12:
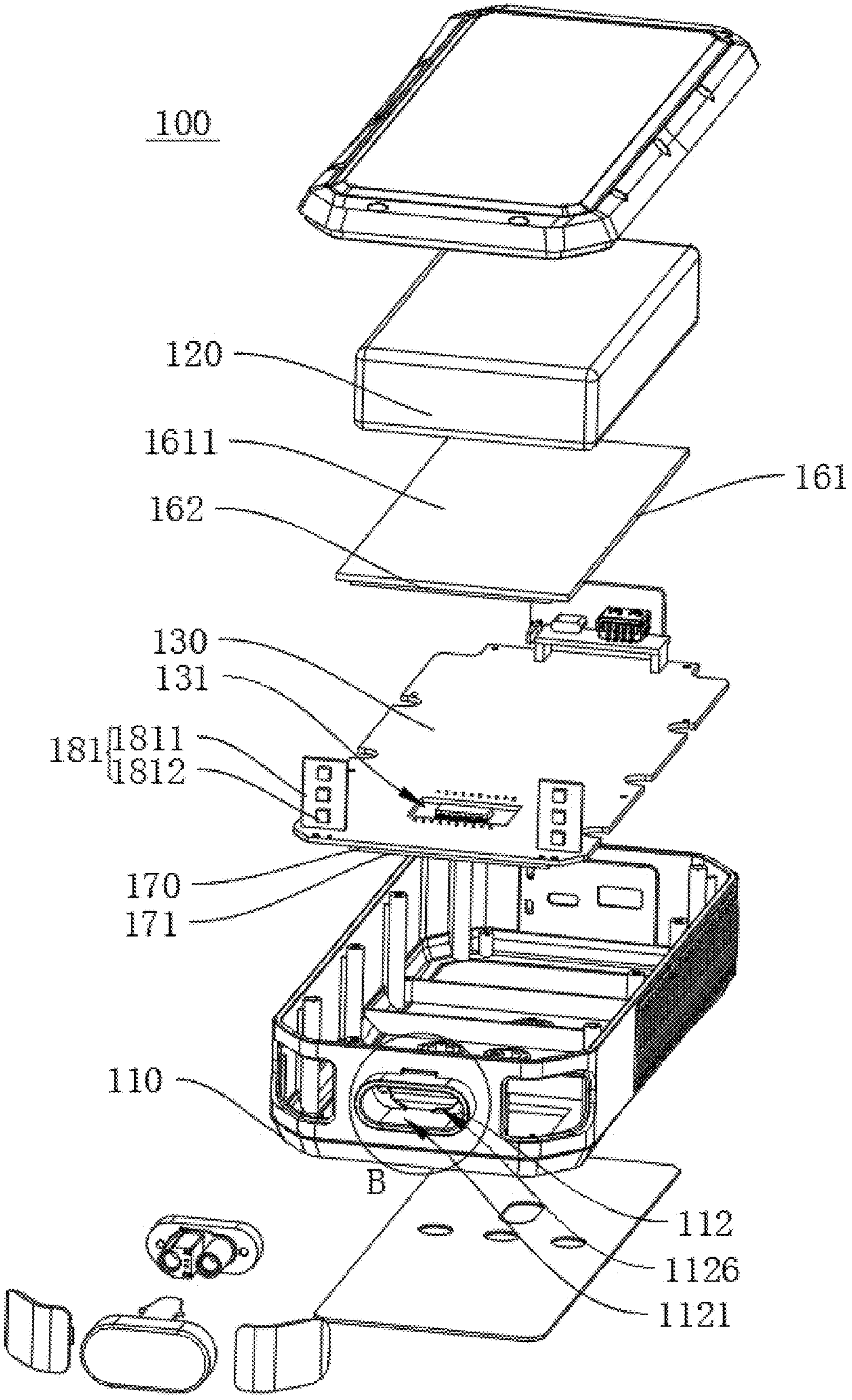
FIG. 12 shows an exploded schematic diagram V of the emergency starting power supply for vehicles in some embodiments of the present disclosure.
Figure 13:
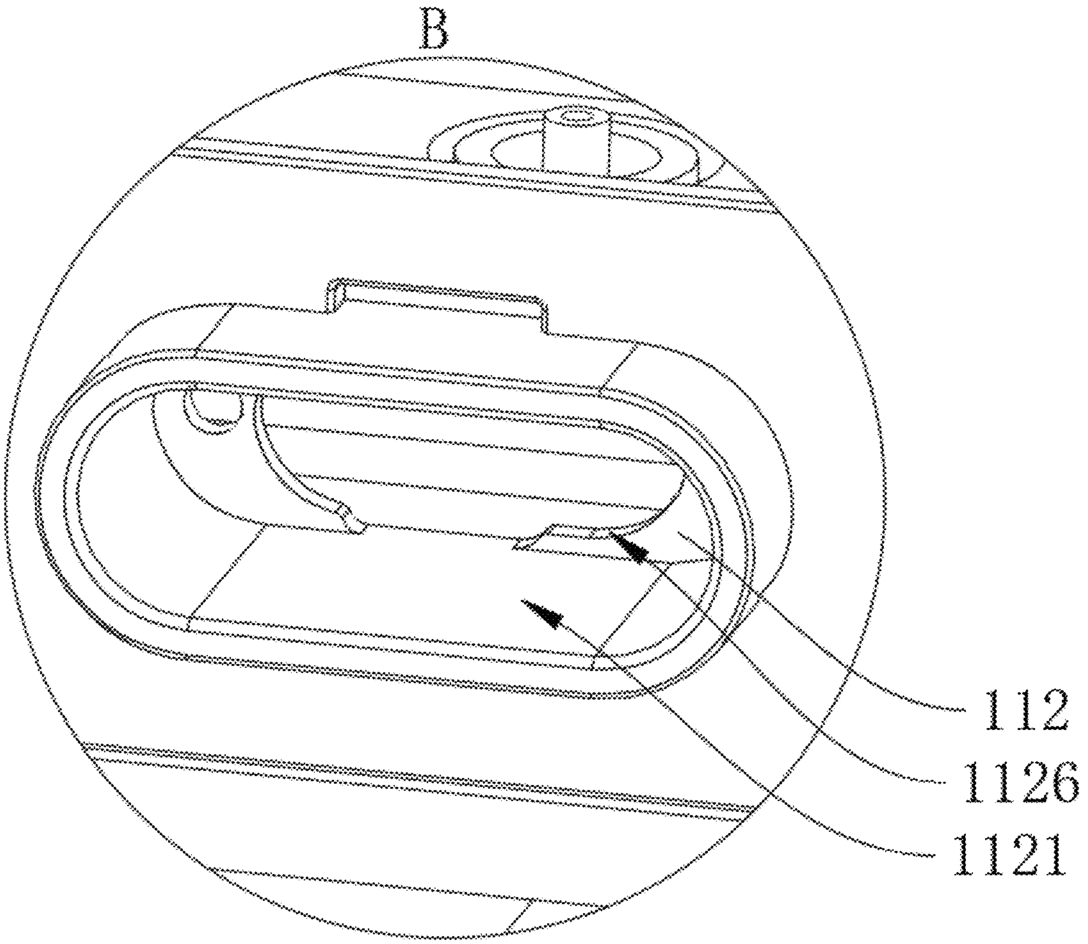
FIG. 13 shows an enlarged schematic view of the structure of part B of FIG. 12.
Figure 14:
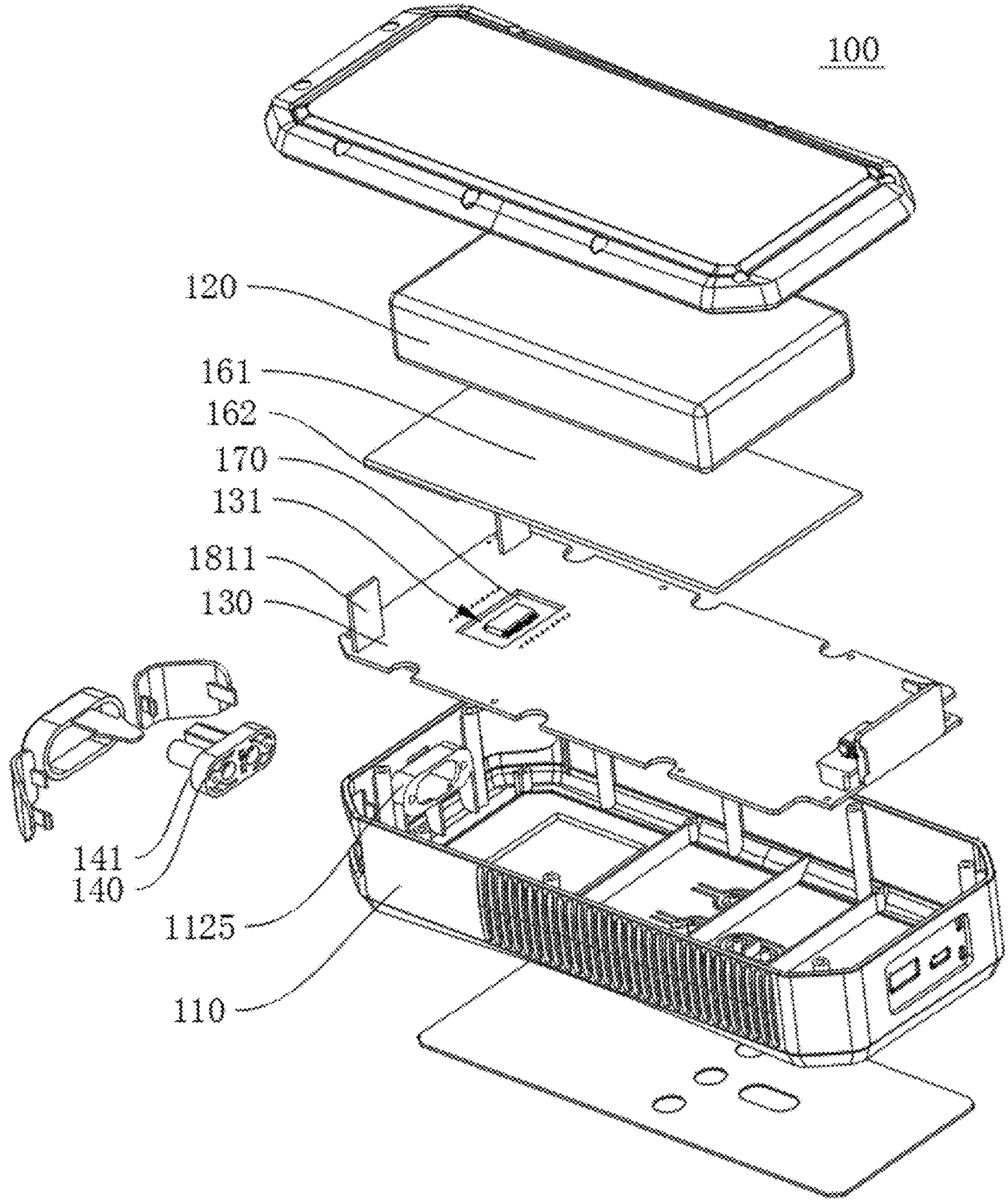
FIG. 14 shows an exploded schematic diagram VI of the emergency starting power supply for vehicles in some embodiments of the present disclosure.

As shown in FIGS. 12, 13, and 14, in the above embodiments of the present disclosure, optionally, the first mounting part 112 is provided with a first through-hole 1126; one end of the output terminal 140 passes through the first through-hole 1126, and one end of the output terminal 140 that does not pass through the first through-hole 1126 is provided with the first coupling part 141. Consequently, it achieves the function of mounting the output terminal 140 on the first mounting part 112.

As shown in FIGS. 12, 13, and 14, in the above embodiments of the present disclosure, optionally, optionally, the first coupling part 141 is connected to the second coupling part 1125 by a screw. As a result, on one hand, the mounting stability and reliability of the output terminal 140 with the first mounting part 112 are improved, and on the other hand, it allows the output terminal 140 to be easily removed from the first mounting part 112, thus facilitating maintenance and replacement.

As shown in FIGS. 12, 13, and 14, in the above embodiments of the present disclosure, optionally, a head of the screw is arranged within the second accommodating space 1121. That is, setting it at one end of the first shell 1101 facing outward, making it convenient to mount or remove the screw with a screwdriver.

As shown in FIG. 1, in one embodiment of the present disclosure, optionally, the shell 110 comprises a first shell 1101 and a second shell 1102; the first shell 1101 is provided with the first mounting part 112; and the second shell 1102 is provided with a button 11022. Therefore, pressing the button 11022 achieves the control of turning on, turning off, and other functions of the emergency starting power supply for vehicles 100.

As shown in FIG. 1, in the above embodiments of the present disclosure, optionally, the second shell 1102 comprises a first sub-second shell 11023 and a second sub-second shell 11024; the first sub-second shell 11023 is provided with a button 11022, and the second sub-second shell 11024 is provided with a second through-hole 110241; and when using the button 11022, the button 11022 undergoes displacement towards the second through-hole 110241. In the embodiment, pressing the button 11022 achieves the control of turning on, turning off, and other functions of the emergency starting power supply for vehicles 100. Simultaneously, the use of different colors, shapes, etc., for the second sub-second shell 11024 and the first sub-second shell 11023 can enhance the overall aesthetics of the emergency starting power supply for vehicles 100.

As shown in FIG. 1, in the above embodiments of the present disclosure, optionally, the button 11022 is integrally molded with the first sub-second shell 11023. This improves the efficiency of the mounting.

Figure 16:
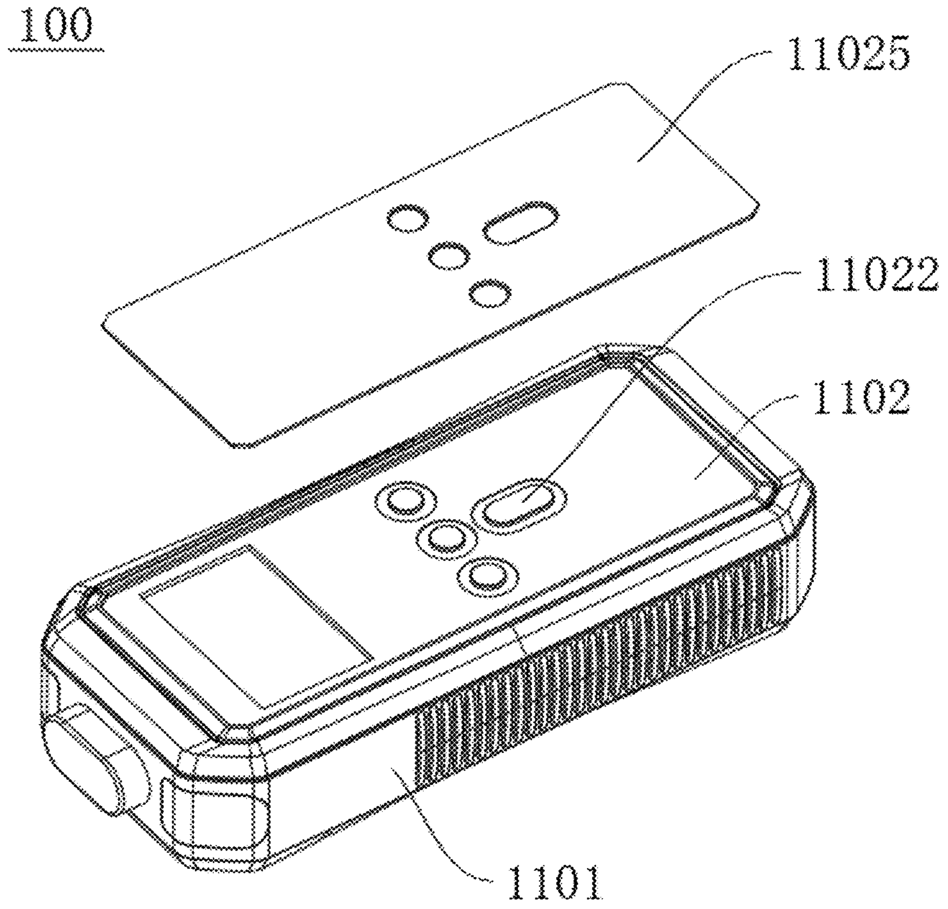
FIG. 16 shows an exploded schematic diagram VII of the emergency starting power supply for vehicles in some embodiments of the present disclosure.

As shown in FIG. 16, in the above embodiment of the present disclosure, optionally, the button 11022 is injection-molded onto the second shell 1102. The button 11022 is made of a material different from the second shell 1102 and is injection-molded onto the second shell 1102, thus enhancing the mounting efficiency. Exemplarily, the button is made of a material of TPU (thermoplastic polyurethane elastomer rubber).

As shown in FIG. 1, in the above embodiment of the present disclosure, optionally, a first translucent layer 11025 is arranged on the second shell 1102. In the embodiment, by arranging the first translucent layer 11025 on the second shell 1102, it serves to transmit and diffuse light, making it easier for users to observe the button 11022 and/or the display device 170. The first translucent layer 11025 also prevents users from visually observing the internal structure of the second shell 1102, thereby enhancing the aesthetics. Exemplarily, a material of the first translucent layer 11025 is one of PVC, PC, or acrylic.

Figure 5:
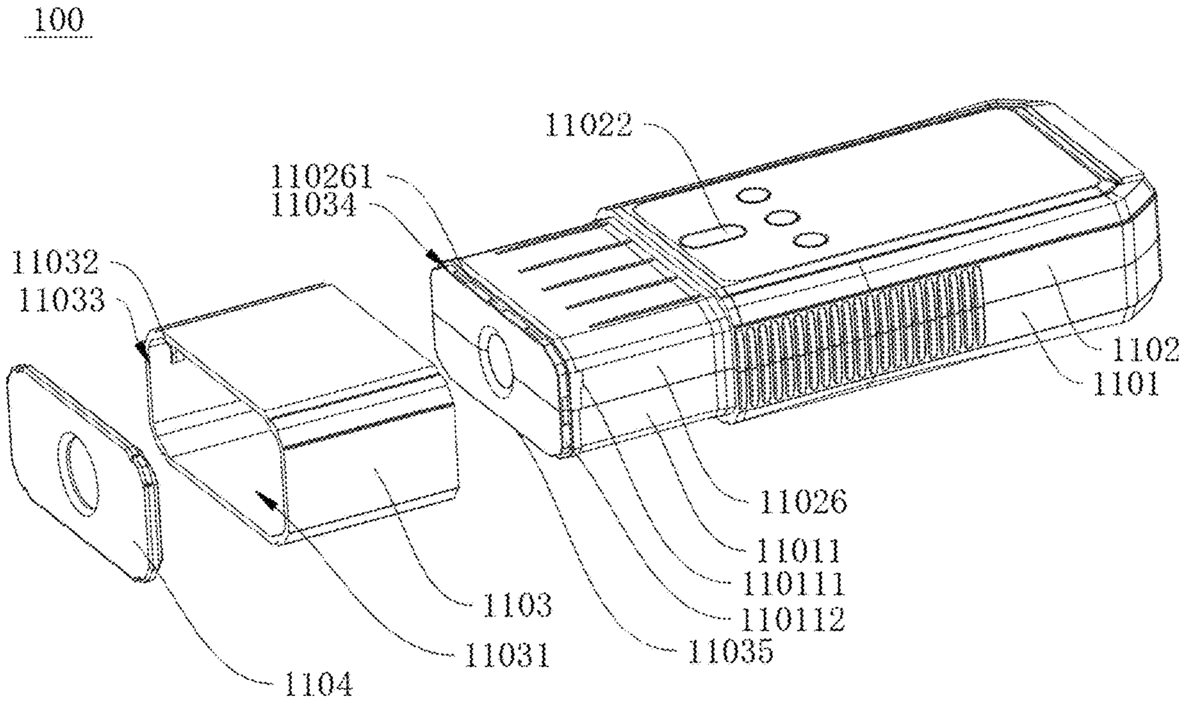
FIG. 5 shows an exploded schematic diagram III of the emergency starting power supply for vehicles in some embodiments of the present disclosure.
Figure 6:
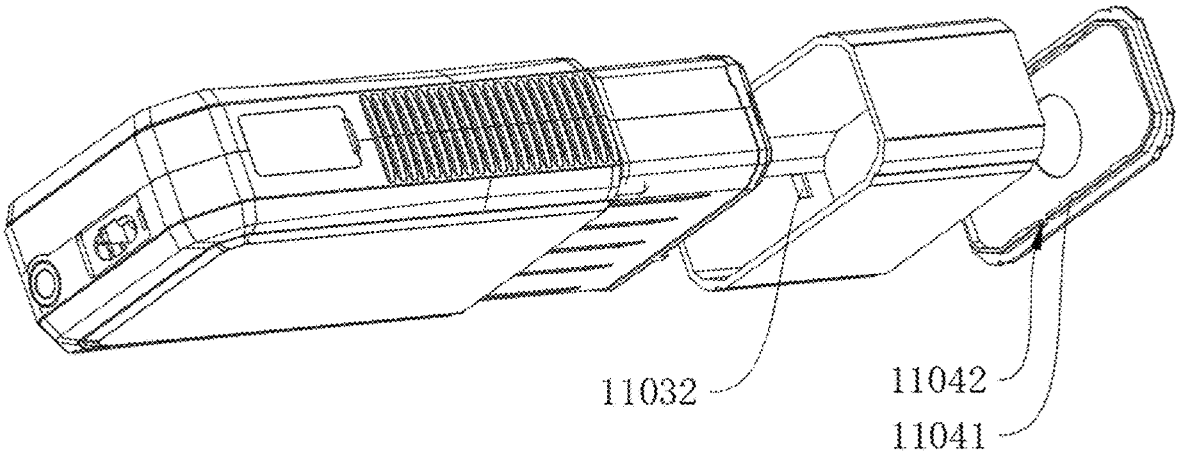
FIG. 6 shows an exploded schematic diagram IV of the emergency starting power supply for vehicles in some embodiments of the present disclosure.

As shown in FIGS. 5 and 6, in the above embodiments of the present disclosure, optionally, the shell 110 further comprises a third shell 1103, wherein the third shell 1103 is provided with a third accommodating space 11031; the first shell 1101 is provided with a first bending part 11011, and the second shell 1102 is provided with a third bending part 11026, and the first bending part 11011 and the third bending part 11026 are housed in the third accommodating space 11031. Therefore, during mounting, the first bending part 11011 of the first shell 1101 and the third bending part 11026 of the second shell 1102 are initially adapted and mounted.

Then, they are collectively housed and mounted in the third accommodating space 11031 of the third shell 1103.

As shown in FIGS. 5 and 6, in some embodiments of the present disclosure, optionally, the third shell 1103 is snapped with the first bending part 11011. In the embodiment, by snapping the third shell 1103 with the first bending part 11011, the mounting stability and reliability between the third shell 1103 and the first shell 1101 are enhanced, thereby preventing the third shell 1103 from detaching from the first bending part 11011 and the third bending part 11026.

As shown in FIGS. 5 and 6, in the above embodiments of the present disclosure, optionally, an inner surface of the third shell 1103 is provided with at least one fourth protrusion 11032, and the first bending part 11011 is provided with at least one fifth protrusion 110111; and the fourth protrusion 11032 is snapped with the fifth protrusion 110111. In the embodiment, by snapping the fourth protrusion 11032 on the inner surface of the third shell 1103 with the fifth protrusion 110111 on the first bending part 11011, it ensures that the third shell 1103 is fixedly mounted on the first bending part 11011 and the third bending part 11026. This prevents the third shell 1103 from detaching from the first bending part 11011 and the third bending part 11026. Additionally, it allows the third shell 1103 to be detachably connected to the first bending part 11011 and the third bending part 11026 so as to facilitate the disassembly, maintenance, or replacement.

As shown in FIGS. 5 and 6, in the above embodiments of the present disclosure, optionally, the fifth protrusion 110111 is arranged at an end away from the button 11022. In this way, when the third shell 1103 is mounted to the predetermined position, it is advantageous for the fourth protrusion 11032 of the third shell 1103 to form a snapping snap fit with the fifth protrusion 110111 of the first bending part 11011.

As shown in FIGS. 5 and 6, in the above embodiments of the present disclosure, optionally, the fifth protrusion 110111 is in a stepped shape. This effectively increases the strength and reliability of the fifth protrusion 110111, thus preventing the fifth protrusion 110111 from being damaged during disassembly or mounting, which will lead to the failure of snapping.

As shown in FIGS. 5 and 6, in the above embodiments of the present disclosure, optionally, the shell 110 also comprises a fourth shell 1104; the third shell 1103 is provided with a third through-hole 11033; the third through-hole 11033 forms the third accommodating space 11031; and the fourth shell 1104 covers the third through-hole 11033 on a side away from the first bending part 11011 and the third bending part 11026. Exemplarily, the fourth shell 1104 covers the third shell 1103, the first bending part 11011, and the third bending part 11026. Therefore, the fourth shell 1104 is made of a material different from the third shell 1103, such as TPU (thermoplastic polyurethane elastomer rubber), which is softer and has a higher frictional force. This not only contributes to the function of containment and mounting of the third shell 1103 to the first bending part 11011 and the third bending part 11026 but also makes it less prone to tipping when the emergency starting power supply for vehicles 100 is placed.

As shown in FIGS. 5 and 6, in the above embodiments of the present disclosure, optionally, the first bending part 11011 is provided with a second bending part 110112, the third bending part 11026 is provided with a fourth bending part 110261, and the fourth shell 1104 is provided with a second protrusion 11041; the second bending part 110112, the fourth bending part 110261, and the third shell 1103 form a fourth accommodating space 11034, and the second protrusion 11041 is housed in the fourth accommodating space 11034. In the embodiment, by housing the second protrusion 11041 in the fourth accommodating space 11034 formed by the second bending part 110112, the fourth bending part 110261, and the third shell 1103, it achieves a tightening effect on the second bending part 110112 and the fourth bending part 110261. This, in turn, fixedly connects the first shell 1101 with the second shell 1102.

As shown in FIGS. 5 and 6, in the above embodiments of the present disclosure, optionally, one side of the second protrusion 11041 is provided with a third opening 11042; and one of the third shell 1103, the second bending part 110112, and the fourth bending part 110261 is provided with a seventh protrusion 11035 that cooperates with the third opening 11042. In the embodiment, the positioning, guiding, and fool-proofing during the mounting process of the fourth shell 1104 are achieved through the arranging of the third opening 11042 and the seventh protrusion 11035. This enhances the mounting efficiency and prevents the fourth shell 1104 from being mounted in the wrong position or reversed.

As shown in FIGS. 5 and 6, in the above embodiments of the present disclosure, optionally, at least one of the third shell 1103, the second bending part 110112, and the fourth bending part 110261 is snapped with the second protrusion 11041. In the embodiment, by snapping at least one of the third shell 1103, the second bending part 110112, and the fourth bending part 110261 with the second protrusion 11041, the second protrusion 11041 is securely mounted in the fourth accommodating space 11034. This, in turn, ensures a stable connection between the first shell 1101 and the second shell 1102.

As shown in FIGS. 12, 13, and 14, in one embodiment of the present disclosure, optionally, the circuit board 130 is arranged between the power source 120 and the shell 110, and a first protective component 161 is arranged between the power source 120 and the circuit board 130. In the embodiment, by arranging the first protective component 161 between the power source 120 and the circuit board 130, it serves to cushion, resist shocks, and insulate, thereby helping to extend the lifespan of the power source 120 and the circuit board 130. Exemplarily, the first protective component 161 is made of EVA foam with excellent shock resistance, cushioning, and thermal insulation properties. When the power source 120 expands at high temperatures, the first protective component 161 provides a certain expansion space for it.

As shown in FIGS. 12, 13, and 14, in the above embodiments of the present disclosure, optionally, at least one side of the first protective component 161 is provided with an adhesive layer 1611. This ensures that the first protective component 161 is securely arranged between the power source 120 and the circuit board 130, thus avoiding displacement of the first protective component 161 away from the position between the power source 120 and the circuit board 130. Therefore, this avoids insulation and vibration-damping failures, thereby preserving the lifespan of the power source 120 and the circuit board 130.

As shown in FIGS. 12, 13, and 14, in the above embodiments of the present disclosure, optionally, a display device 170 is further comprised, and the circuit board 130 is provided with a fourth through-hole 131. The display device 170 is arranged on a side of the circuit board 130 away from the power source 120 and is positioned at the fourth through-hole 131. As a result, the display function of the emergency starting power supply for vehicles 100 is realized. Exemplarily, the display device 170 can be a liquid crystal display or a digital tube display. The drive IC of the display device 170 is arranged on the side of the display device 170 facing the power source 120 and the drive IC is located at the fourth through-hole 131.

As shown in FIGS. 12, 13, and 14, in the above embodiments of the present disclosure, optionally, a second translucent layer 171 is further comprised, wherein the second translucent layer 171 covers the display device 170 on a side away from the circuit board 130. In the embodiment, by arranging the second translucent layer 171 on the side of the display device 170 away from the circuit board 130, it serves to transmit and diffuse light. This facilitates user observation of the displayed information on the display device 170, making the product suitable for use in low-light or nighttime environments. Moreover, the second translucent layer 171 prevents users from visually observing the internal structure of the display device 170 or the shell 110, thereby enhancing the aesthetics.

As shown in FIGS. 12, 13, and 14, in the above embodiments of the present disclosure, optionally, the fourth through-hole 131, on a side near the power source 120, is provided with a second protective component 162. In the embodiment, to protect the driver IC of the display device 170, the second protective component 162 is arranged on the side of the fourth through-hole 131 near the power source 120 and covers the driver IC. This serves as insulation, preventing damage to the driver IC of the display device 170 during disassembly or assembly. It also effectively prevents the heat generated by the power source 120 during use from quickly conducting to the driver IC of the display device 170, thus contributing to extending the lifespan of the display device 170. Exemplarily, the second protective component 162 can be made of highland barley papers with high-temperature resistance and insulating.

As shown in FIGS. 12, 13, and 14, in the above embodiments of the present disclosure, optionally, the second protective component 162 completely covers the fourth through-hole 131, thereby fully covering the drive IC of the display device 170. In other words, after the mounting of the second protective component 162 is completed, a containment space is formed between the second protective component 162 and the circuit board 130, and the drive IC of the display device 170 is housed in the containment space through the fourth through-hole 131. Therefore, it achieves comprehensive coverage protection for the drive IC of the display device 170, thereby promoting the prolonged stability and lifespan of the display device 170.

As shown in FIGS. 12, 13, and 14, in one embodiment of the present disclosure, optionally, a light-emitting element 181 is further comprised, wherein the light-emitting element 181 is arranged on the circuit board 130 or the shell 110, and the circuit board 130 is electrically connected to the light-emitting element 181. In the embodiment, the light-emitting element 181 comprises a square circuit board 1811 and a light source 1812 mounted on the square circuit board 1811. The square circuit board 1811 can be arranged on the circuit board 130 or on the shell 110. When the square circuit board 1811 is arranged on the shell 110, the square circuit board 1811 is electrically connected to the circuit board 130 through a cable. As a result, the function of the emergency lighting of the emergency starting power supply for vehicles 100 is realized.

Figure 10:
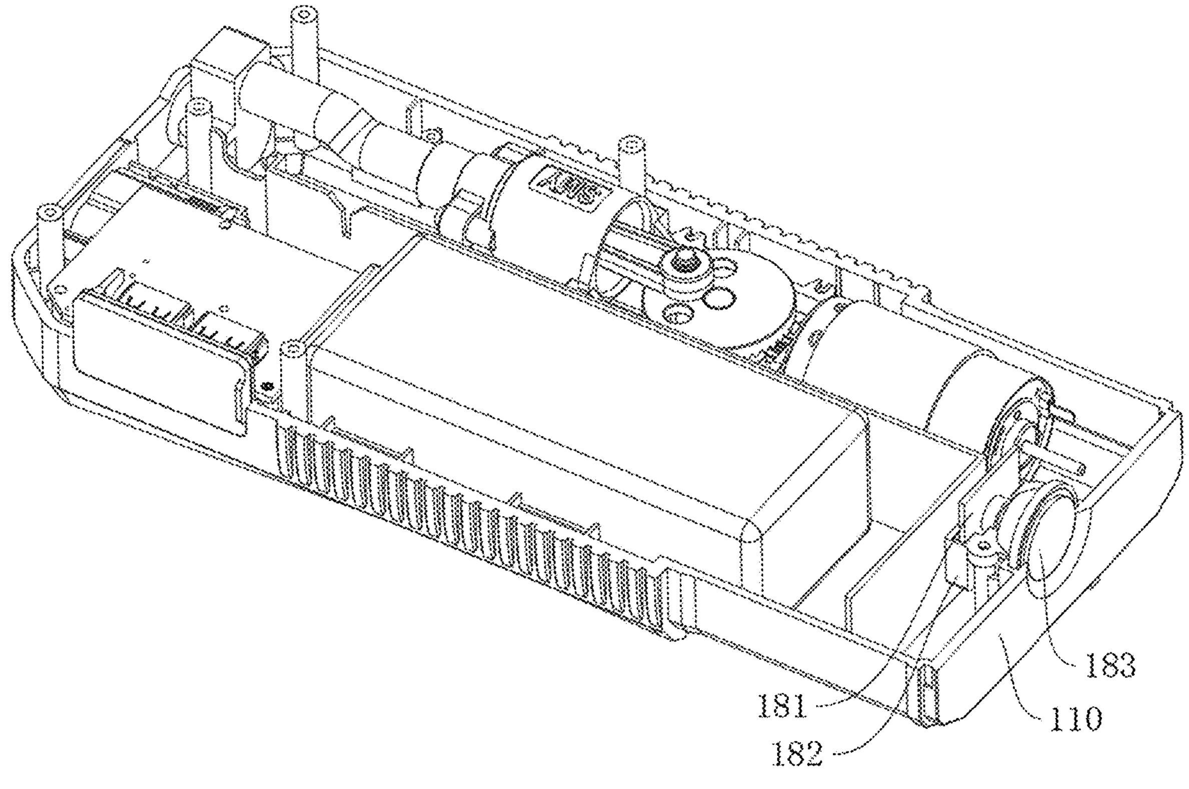
FIG. 10 shows a partial three-dimensional schematic diagram IV of the emergency starting power supply for vehicles in some embodiments of the present disclosure.
Figure 11:
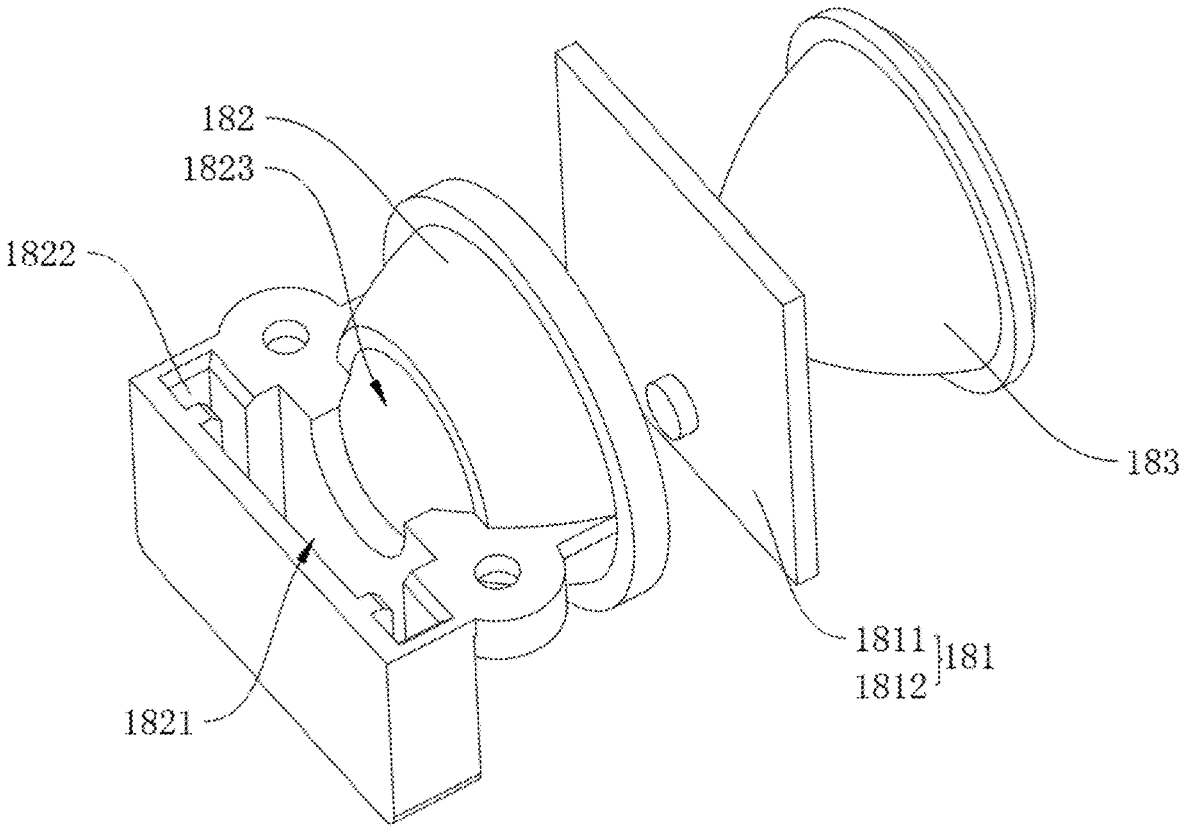
FIG. 11 shows a partially exploded schematic diagram II of the emergency starting power supply for vehicles in some embodiments of the present disclosure.

As shown in FIGS. 10 and 11, in one embodiment of the present disclosure, optionally, a light-emitting element 181 and a first bracket 182 fixed the light-emitting element 181 are further comprised; the light-emitting element 181 is electrically connected to the circuit board 130, and the first bracket 182 is detachably connected to the shell 110. In the embodiment, the light-emitting element 181 comprises a square circuit board 1811 and a light source 1812 mounted on the square circuit board. The square circuit board 1811 is initially fixedly mounted on the first bracket 182, and then the first bracket 182 is detachably connected to the shell 110. Subsequently, the square circuit board 1811 is electrically connected to the circuit board 130 through a cable, thus ensuring the stable mounting of the light-emitting element 181. This achieves the function of the emergency lighting of the emergency starting power supply for vehicles 100.

As shown in FIGS. 10 and 11, in one embodiment of the present disclosure, optionally, the first bracket 182 is provided with a fifth accommodating space 1821, and at least a portion of the light-emitting element 181 is housed in the fifth accommodating space 1821. In the embodiment, the light-emitting element 181 comprises a square circuit board 1811 and a light source 1812 mounted on the square circuit board. The square circuit board 1811 is at least partially housed in the fifth accommodating space 1821, thereby achieving the containment and mounting of the light-emitting element 181 by the first bracket 182.

As shown in FIGS. 10 and 11, in the above embodiment of the present disclosure, optionally, the first bracket 182 is provided with a limiting part 1822, wherein the limiting part 1822 is configured to limit a displacement of the light-emitting element 181 within the fifth accommodating space 1821. In the embodiment, by arranging a limiting part 1822 on the first bracket 182, the displacement of the light-emitting element 181 in the fifth accommodating space 1821 is restricted, thereby enhancing the mounting stability of the light-emitting element 181. This, in turn, improves the stability and reliability of the electrical connection between the light-emitting element 181 and the circuit board 130, thereby enhancing the stability of the emergency lighting function.

As shown in FIGS. 10 and 11, in the above embodiment of the present disclosure, optionally, a lamp cup 183 is further comprised, wherein the first bracket 182 is provided with a sixth accommodating space 1823, and at least a portion of the lamp cup 183 is housed in the sixth accommodating space 1823. Therefore, the first bracket 182 achieves the containment and mounting of the lamp cup 183, thus enhancing the mounting stability of the lamp cup 183. The lamp cup 183 can serve the functions of focusing, reflecting, and controlling the angle of the light beam.

Figure 7:
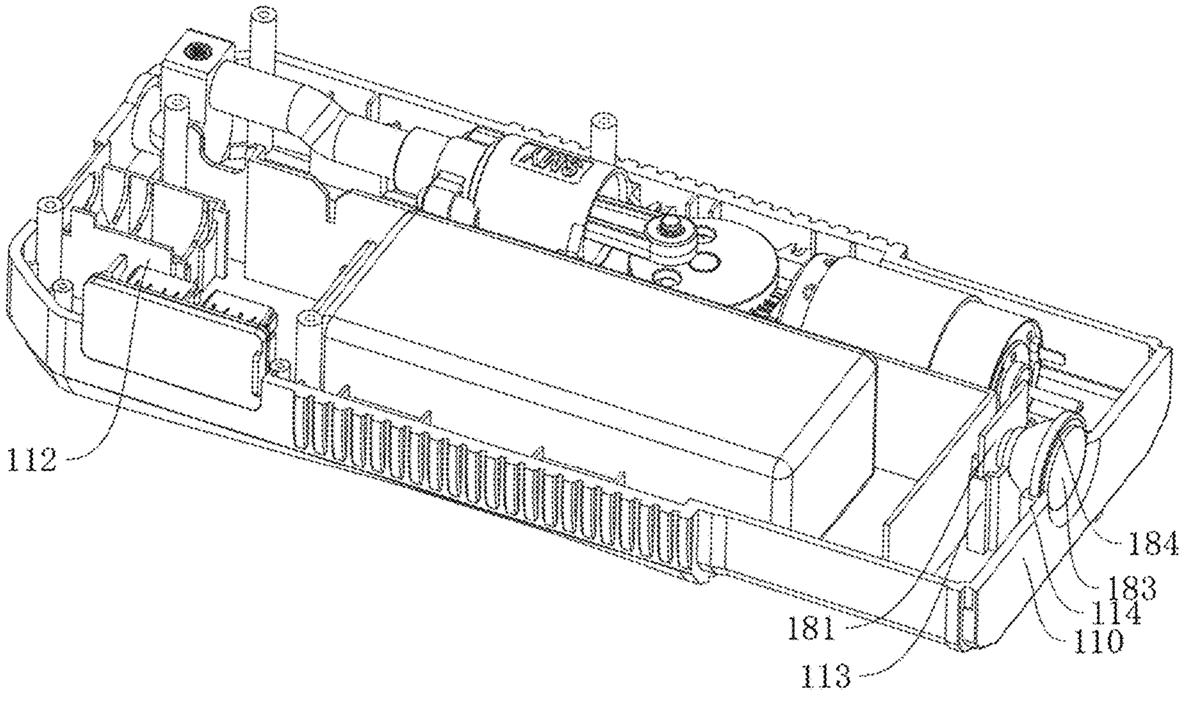
FIG. 7 shows a partial three-dimensional schematic diagram II of the emergency starting power supply for vehicles in some embodiments of the present disclosure.
Figure 8:
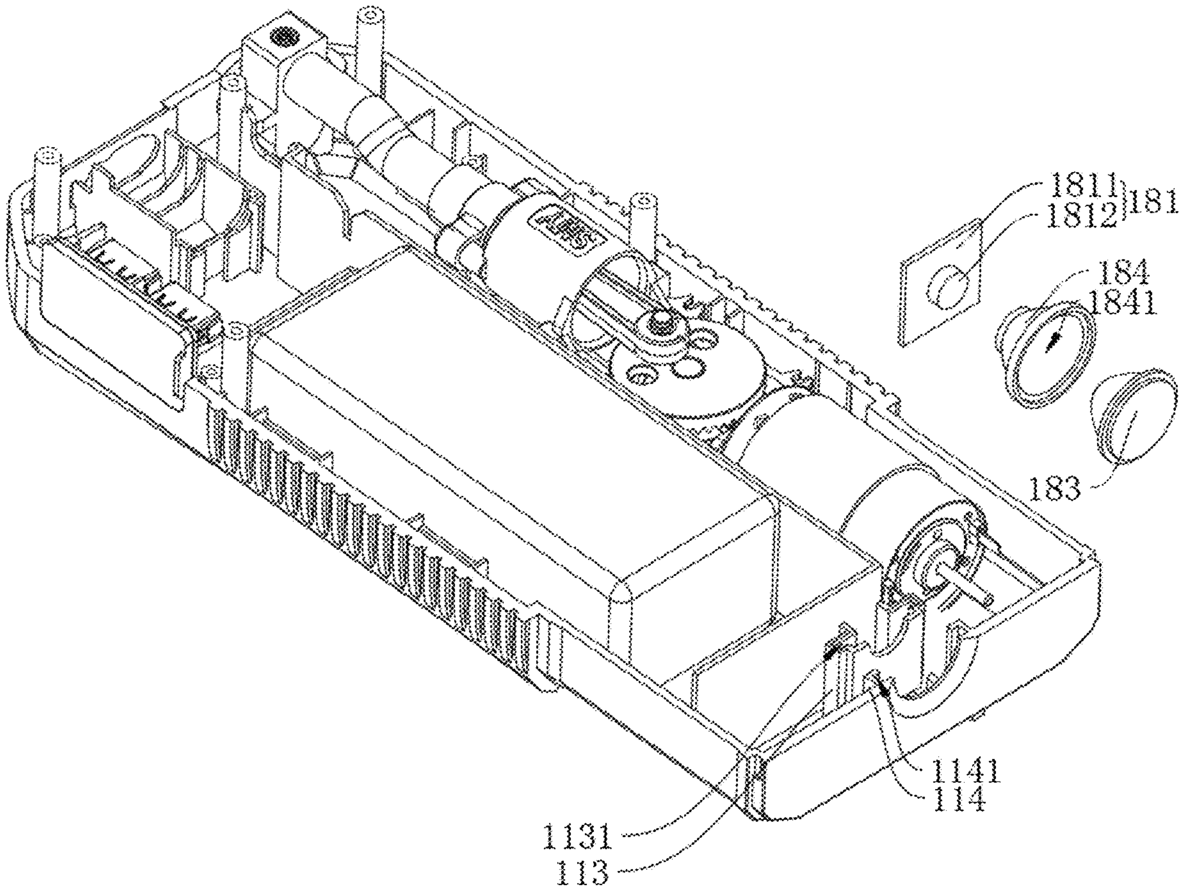
FIG. 8 shows a partially exploded schematic diagram I of the emergency starting power supply for vehicles in some embodiments of the present disclosure.

As shown in FIGS. 7 and 8, in one embodiment of the present disclosure, optionally, a light-emitting element 181 is further comprised, and the shell 110 is provided with a second mounting part 113, and the light-emitting element 181 is arranged on the second mounting part 113. In the embodiment, the second mounting part 113 and the first mounting part 112 can be arranged on the opposite sides of the shell 110, or they can be arranged on the same side of the shell 110 (not indicated in the figure). As a result, by securing the light-emitting element 181 through the shell 110, the function of the emergency lighting of the emergency starting power supply for vehicles 100 is realized.

As shown in FIGS. 7 and 8, in the above embodiment of the present disclosure, optionally, the second mounting part 113 is provided with a seventh accommodating space 1131, and at least a portion of the light-emitting element 181 is housed in the seventh accommodating space 1131. In the embodiment, the light-emitting element 181 comprises a square circuit board 1811 and a light source 1812 mounted on the square circuit board. The square circuit board 1811 is at least partially housed in the seventh accommodating space

1131, thereby achieving the containment and mounting of the light-emitting element 181 by the second mounting part 113.

As shown in FIGS. 7 and 8, in the above embodiment of the present disclosure, optionally, a lamp cup 183 is further comprised, wherein the shell 110 is provided with a third mounting part 114; a first end of the lamp cup 183 is arranged on the second mounting part 113 and is connected to the light-emitting element 181, and a second end of the lamp cup 183 is arranged on the third mounting part 114.

In the embodiment, the shape of the lamp cup 183 is frustum, wherein a radius of the first end of the lamp cup 183 is smaller than a radius of the second end of the lamp cup 183. By arranging the first end of the lamp cup 183 on the second mounting part 113 and connecting it to the light-emitting element 181, and arranging the second end of the lamp cup 183 on the third mounting part 114, the two ends of the lamp cup 183 are stably mounted on the second mounting part 113 and the third mounting part 114, respectively. This enhances the mounting efficiency, stability, and reliability of the lamp cup 183, thus ensuring the stability and reliability of the emergency lighting function and prolonging the lifespan of the product. After the mounting of the emergency starting power supply for vehicles 100 is completed, the shell 110 supports and limits the lamp cup 183.

As shown in FIGS. 7 and 8, in the above embodiment of the present disclosure, optionally, a lamp cup 183 and a lampshade 184 are further comprised, wherein the lampshade 184 is provided with an eighth accommodating space 1841, and at least a portion of the lamp cup 183 is housed in the eighth accommodating space 1841; the shell 110 is provided with a third mounting part 114; a first end of the lampshade 184 is arranged on the second mounting part 113 and is connected to the light-emitting element 181; and a second end of the lampshade 184 is arranged on the third mounting part 114. In the embodiment, the shape of the lamp cup 183 is frustum, wherein a radius of the first end of the lamp cup 183 is smaller than a radius of the second end of the lamp cup 183. The shape of the lampshade 184 is frustum, wherein a radius of the first end of the lampshade 184 is smaller than a radius of the second end of the lampshade 184. By arranging the first end of the lampshade 184 on the second mounting part 113 and connecting it to the light-emitting element 181, and arranging the second end of the lampshade 184 on the third mounting part 114, the two ends of the lampshade 184 are stably mounted on the second mounting part 113 and the third mounting part 114, respectively. This enhances the mounting efficiency, stability, and reliability of the lampshade 184. Simultaneously, by at least partially accommodating the lamp cup 183 in the eighth accommodating space 1841 of the lampshade 184, a stable mounting of the lamp cup 183 is achieved. The lampshade 184 can prevent visible light from leaking from other internal areas of the emergency starting power supply for vehicles 100 when using the emergency lighting function. This includes but is not limited to structural gaps that can allow visible light to be emitted directly, or the transparency of the material itself.

As shown in FIGS. 7 and 8, in the above embodiment of the present disclosure, optionally, the third mounting part 114 is provided with a ninth accommodating space 1141, and at least a portion of the lampshade 184 is housed in the ninth accommodating space 1141. Thus, the third mounting part 114 achieves secure mounting and containment of the lampshade 184.

As shown in FIGS. 7 and 8, in the above embodiment of the present disclosure, optionally, a lowest end of a connection portion between the second mounting part 113 and the lamp cup 183 is higher than a lowest end of a connection portion between the third mounting part 114 and the lamp cup 183. In the embodiment, the shape of the lamp cup 183 is frustum, a lowest end of a connection portion between the second mounting part 113 and the lamp cup 183 is higher than a lowest end of a connection portion between the third mounting part 114 and the lamp cup 183, thereby achieving the stable mounting of the lamp cup 183.

Figure 9:
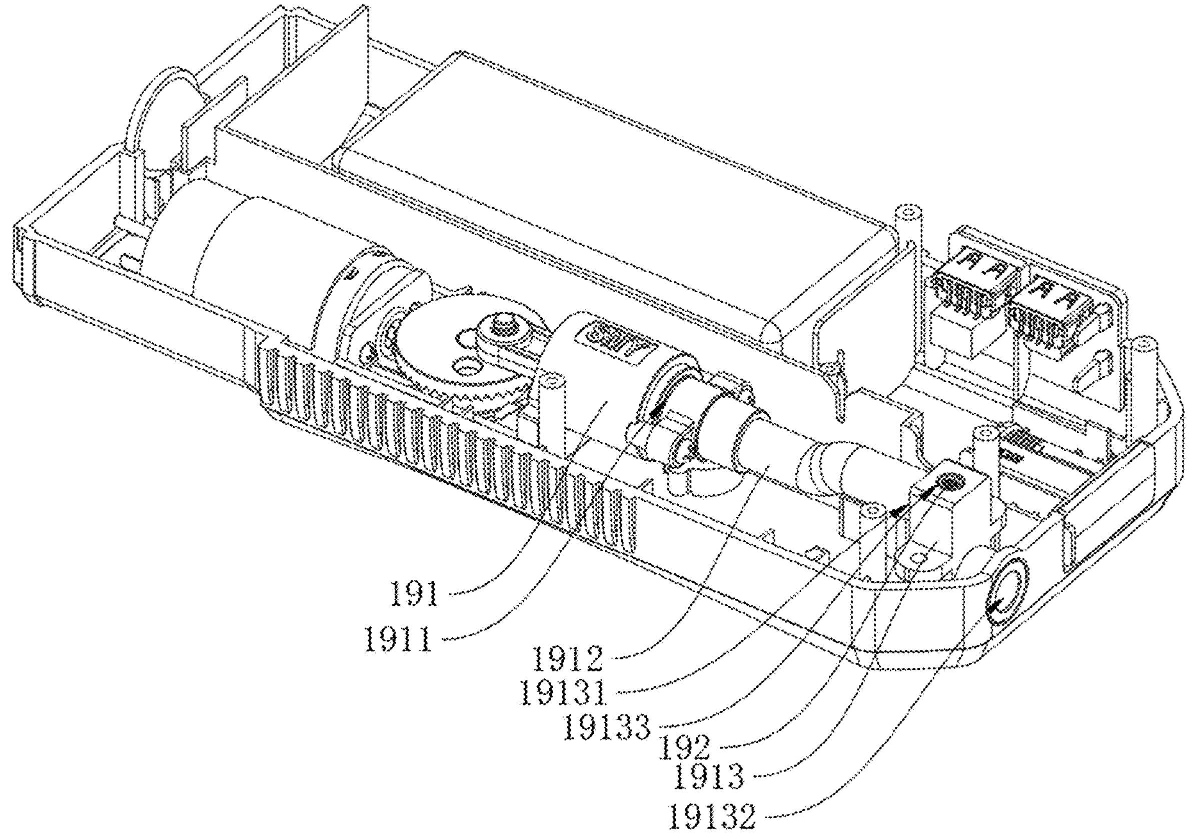
FIG. 9 shows a partial three-dimensional schematic diagram III of the emergency starting power supply for vehicles in some embodiments of the present disclosure.

As shown in FIG. 9, in the above embodiment of the present disclosure, optionally, an inflatable pump 191 is further comprised, wherein the circuit board 130 is electrically connected to the inflatable pump 191. Therefore, the inflation function of the emergency starting power supply for vehicles 100 is realized.

As shown in FIG. 9, in the above embodiment of the present disclosure, optionally, the inflatable pump 191 comprises a first air outlet 1911, a hose 1912, and an air guide member 1913; one end of the hose 1912 is connected to the first air outlet 1911, the other end of the hose 1912 is connected to the air guide member 1913, and the air guide member 1913 is detachably connected to the shell 110. In the embodiment, by connecting the hose 1912 to both the first air outlet 1911 and the air guide member 1913, the gas generated by the inflatable pump 191 can sequentially enter external components to be inflated, such as car tires, through the first air outlet 1911, hose 1912, and air guide member 1913. By detachably connecting the air guide member 1913 to the shell 110, it facilitates the maintenance and replacement of the air guide member 1913.

As shown in FIG. 9, in the above embodiment of the present disclosure, optionally, the air guide member 1913 is provided with an air inlet 19131 and a second air outlet 19132, wherein the air inlet 19131 is connected to the hose 1912, and the air inlet 19131 and the second air outlet 19132 are on different axes. Thus, by arranging the air inlet 19131 and the second air outlet 19132 on the air guide member 1913 along different axes to change the flow direction of the gas, it facilitates the adjustment of the air guide member 1913 to the predetermined position, making it easier to fix and mount.

As shown in FIG. 9, in the above embodiment of the present disclosure, optionally, a sealing member 192 is further comprised, wherein the air guide member 1913 is provided with communication holes 19133 respectively communicating with the air inlet 19131 and the second air outlet 19132, and the sealing member 192 is configured to seal the communication hole 19133. In the embodiment, in order to realize that the air inlet 19131 and the second air outlet 19132 have different axes and are in communication with each other, the air guide member 1913 is formed with communication holes 19133 that respectively communicate with the air inlet 19131 and the second air outlet 19132 during a manufacturing process. The formed communication holes 19133 not only communicate with the air inlet 19131 and the second air outlet 19132 but also communicate with the external environment. That is to say, there are three locations where the air guide member 1913 is in communication with the external environment. To enable the inflatable function of the emergency starting power supply for vehicles 100, a sealing member 192 needs to be arranged at the communication holes 19133 to isolate the communication holes 19133 from the external environment.

As shown in FIG. 9, in the above embodiment of the present disclosure, optionally, an axis of the communication hole 19133 is perpendicular to an axis of the second air outlet. In the embodiment, the sealing member 192 is arranged in the communication hole 19133. The communication hole 19133 can be oriented towards the side where the button 11022 is located in the second direction, or it can face away from the side where the button 11022 is located. Therefore, it facilitates the mounting of the sealing member 192.

In the description of the summary, references to terms such as "an embodiment," "some embodiments," "an example," "specific examples," or "some examples" in the description refer to one or more embodiments or examples of the present disclosure that include specific features, structures, materials, or characteristics described in conjunction with that embodiment or example. In the summary, illustrative expressions of the above terms do not necessarily have to refer to the same embodiments or examples. Moreover, specific features, structures, materials, or characteristics described can be appropriately combined in any one or more embodiments or examples. Additionally, in a non-conflicting manner, those skilled in the art may combine and modify different embodiments or examples and the features of the different embodiments or examples as described in the summary.

While exemplary embodiments of the present disclosure have been shown and described above, it should be understood that these embodiments are illustrative and should not be construed as limiting the scope of the present disclosure. Those skilled in the art can make variations, modifications, substitutions, and alterations to the above embodiments within the scope of the present disclosure.

What is claimed is:

1. An emergency starting power supply for vehicles, comprising a shell, a power source, a circuit board, a light-emitting element, an output terminal, and an inflatable pump, wherein the shell is provided with a first accommodating space and a first mounting part; the power source and the circuit board are housed in the first accommodating space; the power source is electrically connected to the circuit board and the output terminal, respectively; the output terminal is provided with a first coupling part, the first mounting part is provided with a second coupling part, and the first coupling part is detachably connected to the second coupling part; the output terminal is configured to output a current for starting an engine of the vehicles; the first mounting part is provided with a first through-hole, a second accommodating space, and at least one first opening, at least a portion of the output terminal is housed in the second accommodating space, the at least one first opening is configured for mounting cables connected to the output terminal; the shell is provided with a first translucent layer, the shell comprises a first shell and a second shell; the first shell is provided with the first mounting part; the light-emitting element is arranged on the circuit board or the shell, and the circuit board is electrically connected to the light-emitting element; the circuit board is electrically connected to the inflatable pump, the inflatable pump comprises a first air outlet, a hose, and an air guide member, one end of the hose is connected to the first air outlet, the other end of the hose is connected to the air guide member, and the air guide member is detachably connected to the shell.

2. The emergency starting power supply for vehicles according to claim 1, wherein the output terminal is arranged between the first mounting part and the circuit board.

3. The emergency starting power supply for vehicles according to claim 1, wherein a second opening is provided below the at least one first opening.

4. The emergency starting power supply for vehicles according to claim 1, wherein the first coupling part is a first protrusion, and the second coupling part is a receiving groove; during a mounting process, the first coupling part slides through the second coupling part to a predetermined position.

5. The emergency starting power supply for vehicles according to claim 1, wherein one end of the output terminal passes through the first through-hole; and one end of the output terminal that does not pass through the first through-hole is provided with the first coupling part.

6. The emergency starting power supply for vehicles according to claim 5, wherein the first coupling part is connected to the second coupling part by a screw; and a head of the screw is arranged within the second accommodating space.

7. The emergency starting power supply for vehicles according to claim 1, wherein the second shell comprises a first sub-second shell and a second sub-second shell; the first sub-second shell is provided with a button, and the second sub-second shell is provided with a second through-hole; and when using the button, the button undergoes displacement towards the second through-hole.

8. The emergency starting power supply for vehicles according to claim 1, wherein the second shell is provided with the first translucent layer.

9. The emergency starting power supply for vehicles according to claim 1, wherein the shell further comprises a third shell and a fourth shell; the third shell is provided with a third through-hole; the third through-hole forms the third accommodating space; and the fourth shell covers the third through-hole on a side away from the first bending part.

10. The emergency starting power supply for vehicles according to claim 9, wherein the first bending part is provided with a second bending part, and the fourth shell is provided with a second protrusion; and the second bending part and the third shell form a fourth accommodating space, and the second protrusion is housed in the fourth accommodating space.

11. The emergency starting power supply for vehicles according to claim 1, further comprising a display device, wherein the display device is arranged on a side of the circuit board away from the power source.

12. The emergency starting power supply for vehicles according to claim 1, further comprising a display device and a second translucent layer, wherein the second translucent layer covers a side of the display device.

13. The emergency starting power supply for vehicles according to claim 1, further comprising a first bracket fixed to the light-emitting element, wherein the first bracket is detachably connected to the shell.

14. The emergency starting power supply for vehicles according to claim 1, wherein the shell is provided with a second mounting part, and the light-emitting element is arranged on the second mounting part.

15. The emergency starting power supply for vehicles according to claim 1, wherein the air guide member is provided with an air inlet and a second air outlet, and the air inlet is connected to the hose, and the air inlet and the second air outlet are on different axes.

16. The emergency starting power supply for vehicles according to claim 1, wherein a first protective component is arranged on a side of the power source, and the first protective component is configured to provide an expansion space for the power source when the power source expands.

* * * * *